United States Patent [19]
Masleid

[11] Patent Number: 6,025,738
[45] Date of Patent: Feb. 15, 2000

[54] GAIN ENHANCED SPLIT DRIVE BUFFER

[75] Inventor: Robert Paul Masleid, Austin, Tex.

[73] Assignee: International Business Machines Corporation, Armonk, N.Y.

[21] Appl. No.: 08/916,514

[22] Filed: Aug. 22, 1997

[51] Int. Cl.[7] .............................................. H03K 19/0175
[52] U.S. Cl. ............................................... 326/83; 326/95
[58] Field of Search .................................. 321/83, 86, 93, 321/95, 98; 327/374, 379, 108, 112

[56] References Cited

U.S. PATENT DOCUMENTS

| | | | |
|---|---|---|---|
| 4,833,349 | 5/1989 | Liu et al. | 326/86 |
| 5,128,560 | 7/1992 | Chern et al. | 326/83 |
| 5,598,119 | 1/1997 | Thayer et al. | 326/83 |
| 5,604,454 | 2/1997 | Maguire et al. | 326/86 |
| 5,610,548 | 3/1997 | Masleid | 327/374 |

Primary Examiner—Michael Tokar
Assistant Examiner—Don Phu Le
Attorney, Agent, or Firm—Robert V. Wilder; Anthony V. S. England

[57] ABSTRACT

A system and method for increasing the gain per stage and signal edge transition speed, as well as the edge phase accuracy of an input signal. In an exemplary embodiment, a distributed clock signal is produced by an enhanced clock buffer circuit which includes additional weighted static gain chains connected within the buffer circuit. The buffer circuit retains the benefits of the split-drive, dual output transistor configuration, and also substantially improves circuit gain per delay gate by connecting the weighted static gain chains between pulse generators and output transistors of the buffer circuit. The gain chains are designed to rapidly propagate the edge that fires their respective output transistors but slowly propagate the edge that turns the output transistor off, by reducing the devices that propagate the shut-off transition. N-type and p-type devices within the buffer circuit are arranged and sized to promote the gain characteristic of the split drive buffer circuit.

16 Claims, 2 Drawing Sheets

GAIN ENHANCED SPLIT DRIVE BUFFER

FIELD OF THE INVENTION

The present invention relates generally to signal amplification circuitry and more particularly to a buffer circuit having an enhanced gain characteristic.

BACKGROUND OF THE INVENTION

In all electronic circuitry, there is a need to implement signal amplification schemes to obtain optimum signal gain as signals are propagated throughout the system. As an example of such a system, in large, high performance, very large scale integration (VLSI) chips or integrated circuits, an internal clock signal is distributed throughout the chip to control the timing of the chip as a function of an external system clock. Both the external clock signal and the chip-internal clock signal include a rising edge and a falling edge for every clock cycle. The internal clock cycle time is affected by several factors, each of which includes an associated signal propagation delay. The four cycle-affecting factors include storage devices on the chip, clock skew, logic evaluation and signal transmission. The term "clock skew" refers to the variation in clock or clock edge arrival time at various locations within a chip or integrated circuit. Clock "jitter" is another variable in a clock distribution network. Clock jitter refers to the variation in clock periodicity at a given location on a chip. The general term "clock uncertainty" is often used to include skew plus jitter. Of the four cycle-affecting factors, only the logic evaluation performs useful work and the other three factors are overhead that merely add to the cycle time.

The internal clock signal is typically generated from the external clock by a circuit called a clock buffer, and then distributed to the circuits on the chip through some form of on-chip clock distribution network. Ordinarily the clock buffer includes a large inverter that receives the external clock signal and transmits the internal clock signal to the on-chip clock distribution network. The distribution network may have one or more buffer/wiring layers.

It is advantageous to have the clock signal transition between voltage and ground as fast as possible. This entails producing an edge as fast as possible, while maintaining the time at which the edge rises and falls during each clock cycle. A clock edge is susceptible of providing a less accurate reference if the clock edge is slow. This is because noise is always superimposed on the clock. The noise artificially moves the edge position forward or backward in time by temporarily shifting the voltage on the clock distribution. If the edge transition can be made faster, the accuracy of the clock improves because faster clock transitions decrease noise generated clock skew. With less skew, more machine cycle time is available to perform useful logic at a given frequency.

Moreover, clock signal delay through clock buffers needs to be minimized for reduced skew and therefore improved performance. Increasing the number of gain-enhancing stages in a clock buffer normally has the effect of further delaying signal propagation through the buffer. The larger the delay through the clock distribution, the larger will be the skew due to process variation effects and the larger will be the jitter due to power supply variation effects. Thus there is a need to increase the gain of a clock buffer and optimize the gain per stage of the buffer so that circuit delay and clock uncertainty of a clock signal generated for application to a clock distribution circuit can be reduced.

SUMMARY OF THE INVENTION

A method and apparatus is provided for implementing static gain chains connected to output devices within a split-drive buffer circuit. The static gain chains are arranged to rapidly propagate the edge that fires respective output devices, but to slowly propagate the edge that turns the output device to an off state. The gain chains include amplifier device components which are sized to provide optimum gain per delay gate by relating to predetermined edges of an input signal.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Figure 1:
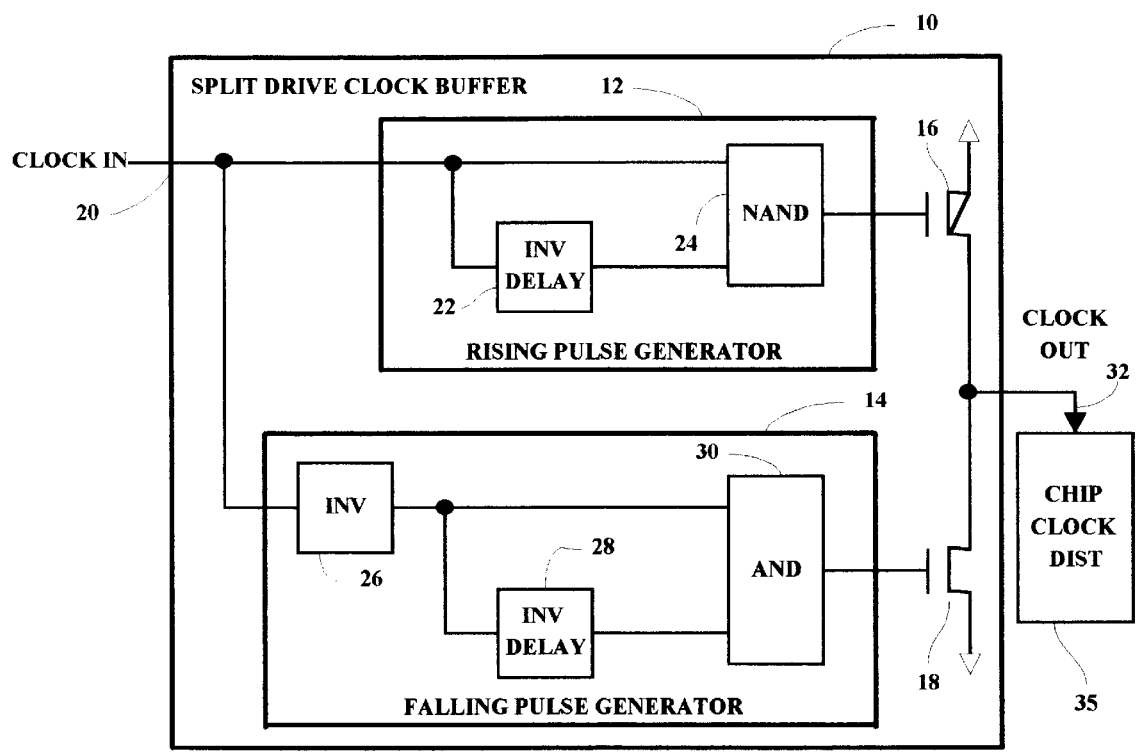
FIG. 1 is a block diagram of a prior art split drive clock buffer.

The split drive clock buffer 10 illustrated in FIG. 1 includes two edge-triggered pulse generators 12 and 14. When an input clock signal 20 transitions, the edge-triggered pulse generator 12 drives an output transistor 16, and the edge-triggered pulse generator 14 drives an output transistor 18. The output of the two output transistors 16 and 18 creates an output clock signal 32, which is arranged to provide an input to an on-chip clock distribution network 35. In the illustrated embodiment, the output transistor 16 is a PFET pull-up transistor, and the output transistor 18 is an NFET pull-down transistor.

The edge-triggered pulse generator 12, called a rising edge pulse generator, includes a delay chain comprising an inverter delay circuit 22 and a NAND gate 24. The input to the inverter delay circuit 22 is the input clock signal 20, and the inputs to the NAND gate 24 include the input clock signal 20 and the output from the inverter delay circuit 22. The edge-triggered pulse generator 14, called a falling edge pulse generator, includes a delay chain comprising an inverter 26, an inverter delay circuit 28 and an AND gate 30. The input to the inverter 26 is the input clock signal 20. The output of the inverter 26 provides an input to both the inverter delay circuit 28 and also the AND gate 30.

On the detection of a rising edge of the input clock signal 20, the rising edge pulse generator 12 briefly activates the output transistor 16, and then de-activates the output transistor 16 before the falling edge begins. On the falling edge of the input clock signal 20, the falling edge pulse generator 14 briefly activates the output transistor 18, and then deactivates the output transistor 18 before the next rising edge of the clock signal occurs. Between the edges of the input clock signal, the output of the split drive clock buffer 10 is in a high impedance or off state.

By separately driving the output transistors 16 and 18, the transition speed of the input clock signal transitions is increased by ensuring that the opposing output transistor is shut down before the next clock signal transition begins. Each clock signal transition begins and ends with a high impedance state. For example, on a rising edge of the input clock signal, the PFET transistor 12 is activated and the NFET transistor 14 has long been deactivated. Leaving the chip clock distribution input in a high impedance state between transitions is harmless. The clock distribution voltage should remain stable between transitions due to its inherent large capacitance and low resistance. The duration of the high impedance condition can be reduced by increasing the pulse widths to the output transistors 16 and 18.

The benefits of the prior art split drive clock buffer illustrated in FIG. 1 are retained and the gain per stage of the buffer is increased using the implementation described in connection with FIG. 2. As illustrated, an input clock signal CL is applied to an inverter circuit 203 within a clock buffer circuit 201. An output from the inverter 203 is applied as an input to a holding inverter circuit 221, the output of which is applied to an output terminal 223 to provide a clock output signal CL OUT from the buffer 201. The clock output signal CL OUT is available for input to a clock distribution circuit of an integrated circuit chip (not shown). The input of the inverter 203 is also connected to the inputs of a NAND gate 205 and a NOR gate 207. The output of the inverter 203 is also connected as the second input to the two-input NAND gate 205 and the two-input NOR gate 207. The output from the NAND gate 205 is connected through two serially connected inverters 209 and 211 to the gate terminal of an output transistor 213.

Similarly, the output of the NOR gate 207 is connected through two serially connected inverter circuits 215 and 217 to a gate terminal of another output transistor 219. Transistor 213 is a pull-up or rising edge transistor in the present example and transistor 219 is a pull-down or falling edge transistor. Transistor 213 is connected between a high level potential, such as 5 volts or 3 volts or less, to the buffer output terminal 223, and transistor 219 is connected between the buffer output terminal 223 and ground potential. The holding inverter circuit 221 is effective to hold the clock state while transistors 213 and 219 are turned off. In the present example, the NAND gate 205 and inverter 203 function as, or comprise, a rising edge pulse generator, and the NOR gate 207 and inverter 203 function as a falling edge pulse generator of the split drive clock buffer 201. Inverters 209 and 211 comprise one static gain chain and inverters 215 and 217 comprise a second static gain chain in the present example.

In prior art inverter chains, each stage is comprised of series PFET or p-type transistors and an NFET or n-type transistors connected between logic "1" and ground. The input is applied to both gate terminals of the transistors and the output is taken from the common point between the output of the transistors in each stage. Typically, each stage has a PFET device size (or gate width) of twice the size of the NFET device. This is so since PFETs are commonly half the strength of NFETs in common CMOS processes. In multi-stage buffers, each successive stage generally has devices which are approximately 3× larger than the previous stage to obtain the best gain per gate delay. It has been found that greater than 3× per stage device size increase allows fewer stages but the stages are much slower. Also, less than 3× per stage device size increase allows faster stages but many more stages are necessary. The present invention allows a much higher value of gain at the greatest gain per delay ratio.

Figure 2:
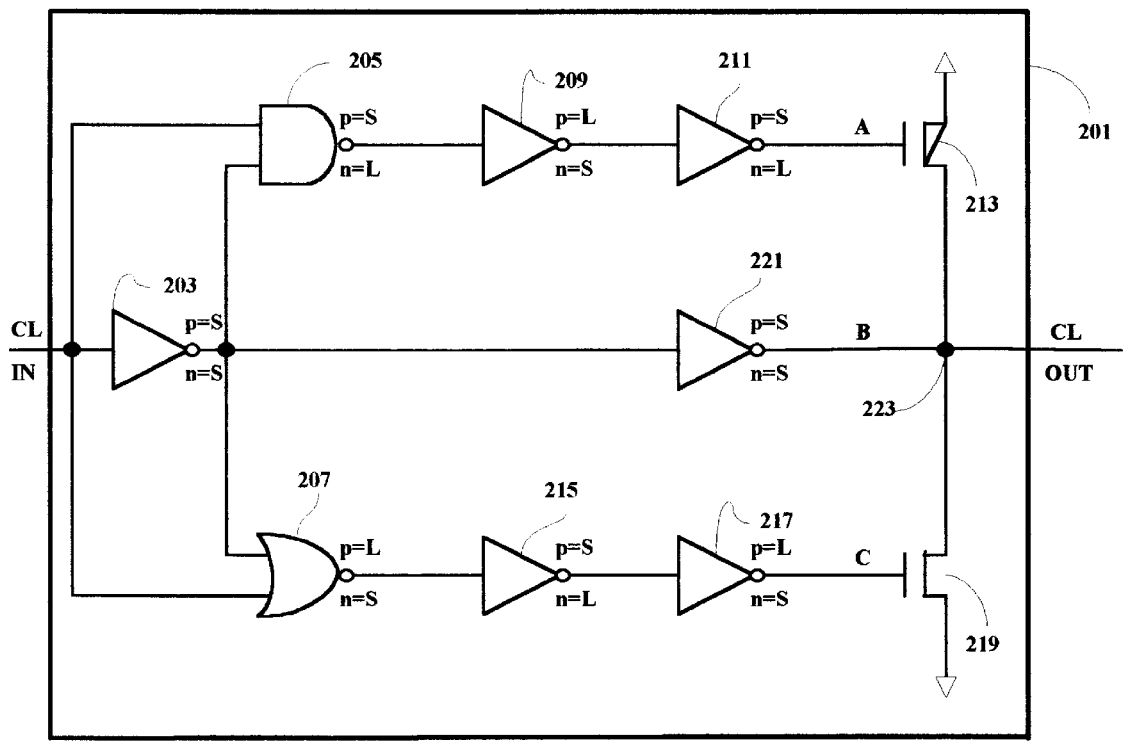
FIG. 2 is a simplified schematic diagram of an exemplary embodiment of a gain enhanced split drive buffer.

The gates and inverters of FIG. 2 each include both an "S" and an "L" size reference designation. Those designations refer to the relative size of the devices within the gates and inverters with which the designators are associated. The sizes are designated relative to a normal size device in a typical prior art inverter or gate device. There are two designator positions for each gate or inverter, an upper designator position and a lower designator position. The size designator in the upper position for each gate or inverter refers to the relative size of the p-type devices within the gate or inverter, and the size designator in the lower position for each gate or inverter refers to the relative size of the n-type devices within the associated gate or inverter. For example, with regard to gate 205, since the "S" is in the upper position at the output of gate 205, all of the p-type devices within the gate are sized to be relatively smaller than would otherwise be implemented in prior art devices. Similarly, since the "L" is in the lower position at the output of gate 205, all of the n-type devices within the gate 205 are sized to be relatively larger than would otherwise be implemented in prior art devices. With regard to inverter 209, since the "L" is in the upper position of the output of the inverter 209, all of the p-type devices within the inverter 209 are sized to be relatively larger than would otherwise be implemented and all of the n-type devices within the inverter 209 are sized to be relatively smaller than would otherwise be implemented as in prior art devices. This "L/S" notation in FIG. 2 identifies a weighted sizing method for sizing gain chains and their internal devices for an optimum gain/delay relationship per stage of the buffer circuit 201. As illustrated, alternate gates within the gain chains are either up-sized or down-sized depending upon whether the particular gain chain is a leading edge processing chain or a falling edge processing chain.

The exemplary gain enhanced split drive clock buffer adds two static, weighted gain chains in a split drive buffer circuit 201 between the pulse generators and the buffer output transistors 213 and 219. A first static gain chain or leading edge processing gain chain includes NAND gate 205, and inverters 209 and 211, respectively, and a second static gain chain or falling edge processing gain chain in the present example includes NOR gate 207 and inverters 215 and 217, respectively. NAND gate 205 also functions together with inverter 203 to form a first pulse generator. Similarly, the NOR gate 207 functions with the inverter 203 to provide a second pulse generator in addition to forming part of the second gain chain.

When the CL IN signal transitions from a "0" logic level to a "1" logic level, the NAND gate 205 momentarily provides a "0" level output pulse for a time equal to the time it takes for the output of the inverter 203 to respond to the CL IN change and go to a logic "0" level. NAND gate 205 then returns to a logic "1" level. Because of the device size "weighting" in NAND gate 205, the output of the first pulse generator circuit including gate 205 and inverter 203, provides only a relatively gradual return to the logic "1" level. That weighted response pulse is applied, after two weighted inversions, as signal "A" to the gate of the output switching device 213. Signal A includes a relatively rapid response to the leading edge of the CL IN signal and a relatively slower response to the trailing edge of the input signal CL IN. Conversely, the second gain chain is effective to provide a signal C for application to the gate of the output switching device 219. Signal C includes a relatively rapid response to the trailing edge of the CL IN signal and a relatively slower response to the leading edge of the input signal CL IN.

The gain chains are designed to rapidly propagate the edge that fires their respective output transistors but slowly propagate the edge that turns the output transistor off. The chains achieve that result by reducing the size of the devices that propagate the shut-off transition by roughly a factor of four in the present example, from what would be normal for a gate function. Accordingly, in FIG. 2, the devices that have been reduced in size are relatively small devices and are designated by the letter "S". The load capacitance saved in shrinking the "S" devices is applied to almost doubling the size of the devices that propagate the turn-on transition. Accordingly, in FIG. 2, the devices that have been increased in size are designated by the letter "L". Since, on the average, half of the devices in the gain chains have been reduced in size or "shrunk" to a relatively insignificant size, and the critical devices roughly doubled, the effective gain-per-stage of buffer 201 is 6x per stage instead of the typical 3x per stage for a simple inverter chain.

The clock load cap is very large so even the switching of numerous other signals produces only a minor change in clock voltage through capacitive coupling. Leakage through the FETs 213 and 219 can also disturb the clock voltage. Between clock transitions, the buffer 201 would be in a tri-state condition when the buffer output FETs 213 and 219 shut off but for the holding inverter or buffer 221 which sustains the clock against minor coupling events and leakage. For each input clock CL transition, one pulse generator will create a pulse, and the other will be inactive. The leading edge of the pulse is rapidly propagated and amplified through the associated weighted chain and turns on one of the two output FETs 213 or 219. The holding buffer 221 is sized so that it is easily overcome by the main output drive. The holding buffer 221 later transitions to agree with the new output state before the main output drive goes into tristate. The pulse trailing edge is slowly propagated and not amplified as much, and turns off the output FET.

Figure 3:
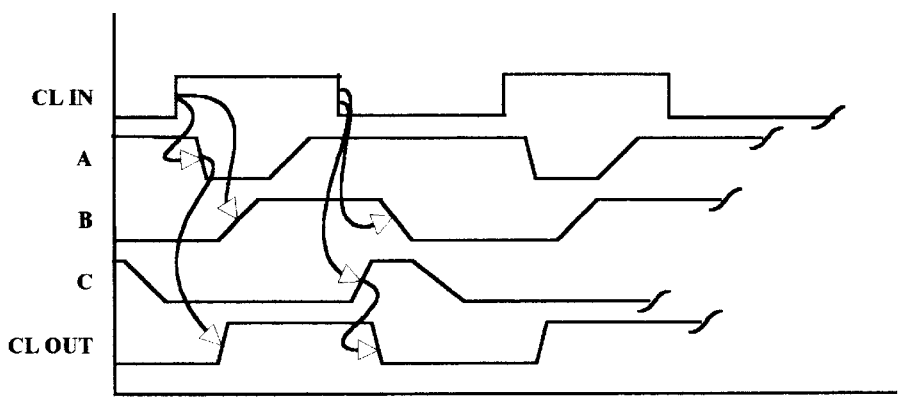
FIG. 3 is a timing chart illustrating the relationships between several of the signals within the exemplary embodiment.

The relationships between various signals CL IN, A, B, C, and CL OUT, within the split drive buffer 201 are shown in the timing chart illustrated in FIG. 3. As illustrated, the first gain chain which processes the rising edge of the clock signal, generates signal "A" having a fast leading edge and a relatively slower trailing edge, to quickly propagate the rising edge of the input clock signal CL IN to the output switching device 213. The second gain chain which processes the second or falling edge of the clock signal in the present example, and generates signal "C" which is effective to rapidly propagate the falling edge of the clock input signal CL IN through output device 219.

As illustrated in connection with the present example, the addition of two gain chains inside the buffer allows nearly all of the gain of the chains to be applied to the device in the next stage that operates on changing the state of the clock signal. Virtually none of the gain is spent on releasing the clock signal from its previous state. That eliminates half of the gate load from the amplification chains through which the clock edges propagate. As a result, this allows the optimal gain of approximately 6x per stage in the present example, for minimum delay. The 6x gain represents a significant gain per stage from traditional values of typically 3x per stage. Any delay inherent in the NAND and NOR gates is more than recovered by the operation of the gain chains. This increased gain per stage allows fewer stages and hence less delay through the buffer. Since circuit delay is reduced, clock uncertainty is also reduced because voltage, temperature and process variables have a reduced basic delay to perturb.

The method and apparatus of the present invention has been described in connection with a preferred embodiment as disclosed herein. Although an embodiment of the present invention has been shown and described in detail herein, along with certain variants thereof relative to an exemplary clock distribution application, it is noted that the present invention is useful in any amplification application, such as, although not limited to, on-chip and off-chip drivers and buffers, and to many other varied embodiments that incorporate the teachings of the invention as may be easily constructed by those skilled in the art. The present invention may also be easily included or integrated into a processor or CPU or other larger system integrated circuit or chip, including application specific integrated circuits or ASICs. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A buffer circuit for receiving an input signal at a buffer input terminal and providing an output signal at a buffer output terminal, said buffer circuit comprising:

a first pulse generator arranged for receiving said input signal, said first pulse generator being responsive to a rising edge of said input signal for providing a first pulse signal;

a second pulse generator arranged for receiving said input signal, said second pulse generator being responsive to a falling edge of said input signal for providing a second pulse signal;

a first gain chain circuit connected to said first pulse generator;

a first output switching device connected to said first gain chain circuit, said first output switching device being responsive to said first pulse signal for connecting said buffer output terminal to a first voltage level;

a second gain chain circuit connected to said second pulse generator;

a second output switching device connected to said second gain chain circuit, said second output switching device being responsive to said second pulse signal for connecting said buffer output terminal to a second voltage level; and a holding circuit connected between said buffer input terminal and said buffer output terminal.

2. The buffer circuit as set forth in claim 1 wherein said input signal comprises a clock input signal, said output signal comprising a clock output signal, said buffer output terminal being arranged for selective connection to a clock signal distribution circuit.

3. The buffer circuit as set forth in claim 2 wherein said clock signal distribution circuit comprises a clock distribution network of an integrated circuit.

4. The buffer circuit as set forth in claim 1 wherein said first and second output switching devices comprise first and second output transistors, respectively.

5. The buffer circuit as set forth in claim 4 wherein said first output transistor comprises an PMOS device.

6. The buffer circuit as set forth in claim 5 wherein said second output transistor comprises an NMOS device.

7. A method for enhancing gain of an amplifier device, said method comprising:

providing a first gain chain circuit responsive to a first edge of an input signal to amplify said first edge to a relatively greater gain than a subsequent edge of the input signal;

providing a second gain chain circuit responsive to a second edge of the input signal to amplify said second edge to a relatively greater gain than said first edge of the input signal, said first and second gain chain circuits including a like number of corresponding amplifier devices, said first gain chain circuit including amplifier components therein sized oppositely relative to corresponding amplifier components within corresponding ones of said amplifier devices within said second gain chain circuit.

8. A buffer circuit comprising:

a buffer input terminal means;

a buffer output terminal means;

a first chain amplifier circuit connected between said buffer input terminal means and said buffer output terminal means; and a second chain amplifier circuit connected between said buffer input terminal means and said buffer output terminal means, said first and second chain amplifier circuits including a like number of corresponding amplifier devices wherein each of said amplifier devices in said first chain amplifier circuit has amplifier components therein sized oppositely relative to corresponding amplifier components within corresponding ones of said amplifier devices within said second chain amplifier circuit, each of said amplifier devices including first and second types of amplifier components, said size of said amplifier components being selected from a group of at least a relatively large size amplifier component and a relatively small size amplifier component, said size of said amplifier components being dependent upon said type of said amplifier component.

9. The buffer circuit as set forth in claim 8 wherein said first chain amplifier circuit is arranged to respond to only one edge of an input signal.

10. The buffer circuit as set forth in claim 9 wherein said second chain amplifier circuit is arranged to respond to only a second edge of said input signal.

11. The buffer circuit as set forth in claim 8 wherein said amplifier components are comprised of n-type and p-type solid state devices.

12. The buffer circuit as set forth in claim 11 wherein said p-type amplifier components are of a relatively large size compared to said n-type amplifier components in alternate ones of said amplifier devices.

13. The buffer circuit as set forth in claim 11 wherein said p-type amplifier components are of a relatively small size compared to said n-type amplifier components in alternate ones of said amplifier devices.

14. The buffer circuit as set forth in claim 11 wherein said n-type amplifier components are of a relatively large size compared to said n-type amplifier components in alternate ones of said amplifier devices.

15. The buffer circuit as set forth in claim 11 wherein said n-type amplifier components are of a relatively small size compared to said n-type amplifier components in alternate ones of said amplifier devices.

16. The buffer circuit as set forth in claim 11 wherein said solid state devices are p-type and n-type transistors.

* * * * *